US011266011B2

(12) United States Patent
Noh et al.

(10) Patent No.: US 11,266,011 B2
(45) Date of Patent: Mar. 1, 2022

(54) ELECTRONIC DEVICE INCLUDING PRINTED CIRCUIT BOARD HAVING SHIELDING STRUCTURE

(71) Applicant: Samsung Electronics Co., Ltd., Suwon-si (KR)

(72) Inventors: Juseok Noh, Suwon-si (KR); Taejin Kang, Suwon-si (KR); Sunghyun Kim, Suwon-si (KR); Seonghyeon Lee, Suwon-si (KR); Daechul Jeong, Suwon-si (KR); Seongmin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/148,913

(22) Filed: Jan. 14, 2021

(65) Prior Publication Data

US 2021/0251070 A1 Aug. 12, 2021

(30) Foreign Application Priority Data

Feb. 10, 2020 (KR) .................... 10-2020-0015928

(51) Int. Cl.
*H05K 1/14* (2006.01)
*H05K 1/02* (2006.01)
*H05K 1/11* (2006.01)

(52) U.S. Cl.
CPC ........... *H05K 1/0218* (2013.01); *H05K 1/115* (2013.01); *H05K 1/144* (2013.01);
(Continued)

(58) Field of Classification Search
CPC ...... H05K 1/0218; H05K 1/144; H05K 1/115; H05K 2201/093; H05K 2201/10378; H05K 2201/10128
(Continued)

(56) References Cited

U.S. PATENT DOCUMENTS 6,888,063 B1  5/2005  Lien et al.
6,965,072 B2  11/2005 Gustafsson et al.
(Continued)

FOREIGN PATENT DOCUMENTS

JP   05-082962 A   4/1993
JP   2005-183410 A  7/2005
(Continued)

OTHER PUBLICATIONS

International Search Report dated Apr. 27, 2021, issued in International Patent Application No. PCT/KR2021/000516.

*Primary Examiner* — Sherman Ng
(74) *Attorney, Agent, or Firm* — Jefferson IP Law, LLP

(57) ABSTRACT

An electronic device including a shielding structure is provided. The electronic device includes a housing, a first board disposed in an inner space of the housing and including a first electrical element and a first ground layer, a second board disposed in the inner space to be spaced apart from the first board and including a second electrical element, and an interposer disposed between the first board and the second board so as to electrically connect the first board and the second board to each other. The second board includes a first surface facing the first board, a second surface facing away from the first surface, insulating layers disposed between the first surface and the second surface, first slits formed at a predetermined interval in a first conductive area disposed in a first insulating layer among the insulating layers, and second slits formed at a predetermined interval in a second conductive area disposed in a second insulating layer between the first insulating layer and the second surface. The first slits are disposed at a position where the plurality of first slits do not overlap the plurality of second slits in case the second board is viewed from above.

19 Claims, 8 Drawing Sheets

(52) U.S. Cl.
CPC ............... *H05K 2201/093* (2013.01); *H05K 2201/10128* (2013.01); *H05K 2201/10378* (2013.01)

(58) Field of Classification Search
USPC ................................................ 361/784, 792
See application file for complete search history.

(56) References Cited

U.S. PATENT DOCUMENTS

| | | | |
|---|---|---|---|
| 8,208,270 B2 * | 6/2012 | Mori ..................... | H05K 3/368 361/792 |
| 2003/0206405 A1 | 11/2003 | Zu et al. | |
| 2012/0243195 A1 * | 9/2012 | Lim ...................... | H05K 1/141 361/784 |
| 2014/0168908 A1 * | 6/2014 | Chuang ............... | H05K 1/0218 361/735 |
| 2016/0088733 A1 | 3/2016 | Lee et al. | |
| 2019/0103346 A1 * | 4/2019 | Goh .................. | H01L 23/49827 |
| 2019/0319381 A1 * | 10/2019 | Bang ................... | H05K 1/0224 |

FOREIGN PATENT DOCUMENTS

| | | |
|---|---|---|
| JP | 2012-227552 A | 11/2012 |
| KR | 10-2010-0082551 A | 7/2010 |
| KR | 10-2016-0033492 A | 3/2016 |

\* cited by examiner

ELECTRONIC DEVICE INCLUDING PRINTED CIRCUIT BOARD HAVING SHIELDING STRUCTURE

CROSS-REFERENCE TO RELATED APPLICATION(S)

This application is based on and claims priority under 35 U.S.C. § 119 of a Korean patent application number 10-2020-0015928, filed on Feb. 10, 2020, in the Korean Intellectual Property Office, the disclosure of which is incorporated by reference herein in its entirety.

BACKGROUND

1. Field

The disclosure relates to an electronic device including a shielding structure.

2. Description the Related Art

In order to secure competitiveness of products among different manufacturers, electronic devices are being gradually slimmed, and are being developed to increase the rigidity and improve the aesthetic appearance thereof, as well as to differentiate functional elements thereof.

A plurality of electronic components disposed in the internal space of an electronic device have to be disposed in a space-efficient manner with respect to each other in order to help slim the electronic device. In addition, even if a plurality of electronic components are disposed in a space-efficient manner in the internal space of an electronic device, quality deterioration of the electronic device may be caused if the functions of the components are not properly realized due to interference therebetween. Therefore, there is a trend toward developing electronic devices such that electronic components are arranged in a space-efficient manner while avoiding interference therebetween.

The above information is presented as background information only to assist with an understanding of the disclosure. No determination has been made, and no assertion is made, as to whether any of the above might be applicable as prior art with regard to the disclosure.

SUMMARY

An electronic device may include at least two boards (e.g., printed circuit boards (PCBs)) disposed in the inner space thereof. The boards may be disposed in a manner of being stacked on one another in order to secure an efficient mounting space, and the boards may be electrically connected to each other via an interposer disposed therebetween. For example, each of the boards may include a plurality of conductive terminals, and the at least two boards may be electrically connected to each other by being in physical contact with a plurality of corresponding conductive terminals disposed on corresponding surfaces of the interposer.

Any one of the at least two boards may have therein a plurality of slits arranged at predetermined intervals so as to reduce a deviation in remained copper ratio for each area of the board for preventing damage or warpage due to an external impact.

However, these slits are used as paths for the passage of noise generated from a first electrical element mounted on a first board, whereby a problem of deterioration of the performance of a second electrical element mounted on a second board may occur. Furthermore, in order to solve this problem, a shielding structure (e.g., a shield can) may be disposed on the second electrical element, but this may make slimming the electronic device more difficult. In addition, on the second board, a shielding paint may be applied between the first electrical element and the second electrical element. However, this also requires a separate additional working operation, which may result in degradation of productivity.

Aspects of the disclosure are to address at least the above-mentioned problems and/or disadvantages and to provide at least the advantages described below. Accordingly, an aspect of the disclosure is to provide an electronic device including a board having a shielding structure.

Another aspect of the disclosure is to provide an electronic device including a board improved in remained copper ratio and having a shielding structure.

Another aspect of the disclosure is to provide an electronic device including a board having a noise-blocking structure without needing a separate additional working operation.

Another aspect of the disclosure is to provide an electronic device including a board having a shielding structure configured to contribute to slimming of the electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a first board disposed in an inner space of the housing and including a first electrical element and a first ground layer, a second board disposed in the inner space to be spaced apart from the first board and including a second electrical element, and an interposer disposed between the first board and the second board so as to electrically connect the first board and the second board to each other. The second board may include a first surface facing the first board, a second surface facing away from the first surface, a plurality of insulating layers disposed between the first surface and the second surface, a plurality of first slits formed at a predetermined interval in a first conductive area disposed in a first insulating layer among the plurality of insulating layers, and a plurality of second slits formed at a predetermined interval in a second conductive area disposed in a second insulating layer between the first insulating layer and the second surface. The plurality of first slits may be disposed at a position where the plurality of first slits do not overlap the plurality of second slits in case the second board is viewed from above.

In accordance with another aspect of the disclosure, an electronic device is provided. The electronic device may include a housing, a first board disposed in an inner space of the housing, the first board including a first electrical element and a first ground layer, a second board disposed in the inner space to be spaced apart from the first board and including a second electrical element, and an interposer disposed between the first board and the second board to electrically connect the first board and the second board to each other. The second board may include a first surface facing the first board, a second surface facing away from the first surface, a plurality of insulating layers disposed between the first surface and the second surface, a plurality of first non-conductive areas disposed at a predetermined interval in a first conductive area disposed in a first insulating layer among the plurality of insulating layers, and a plurality of second non-conductive areas disposed at a predetermined interval in a second conductive area disposed in a second insulating layer between the first insulating layer and the second surface. The first conductive area may be disposed to overlap the plurality of second non-conductive areas in case the second board is viewed from above.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and its advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
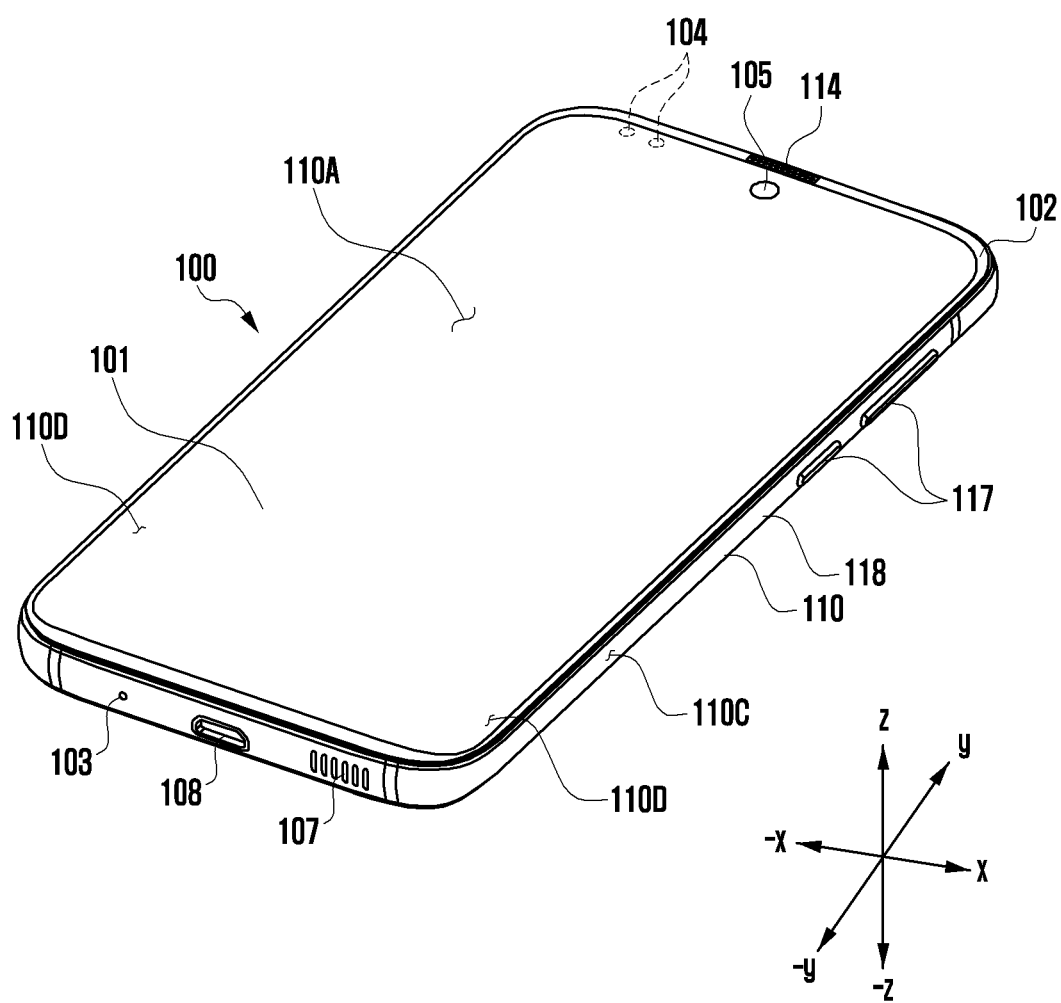
FIG. 1 is a perspective view illustrating a front surface of an electronic device according to an embodiment of the disclosure.

FIG. 1 illustrates a perspective view showing a front surface of a mobile electronic device according to an embodiment of the disclosure.

Figure 2:
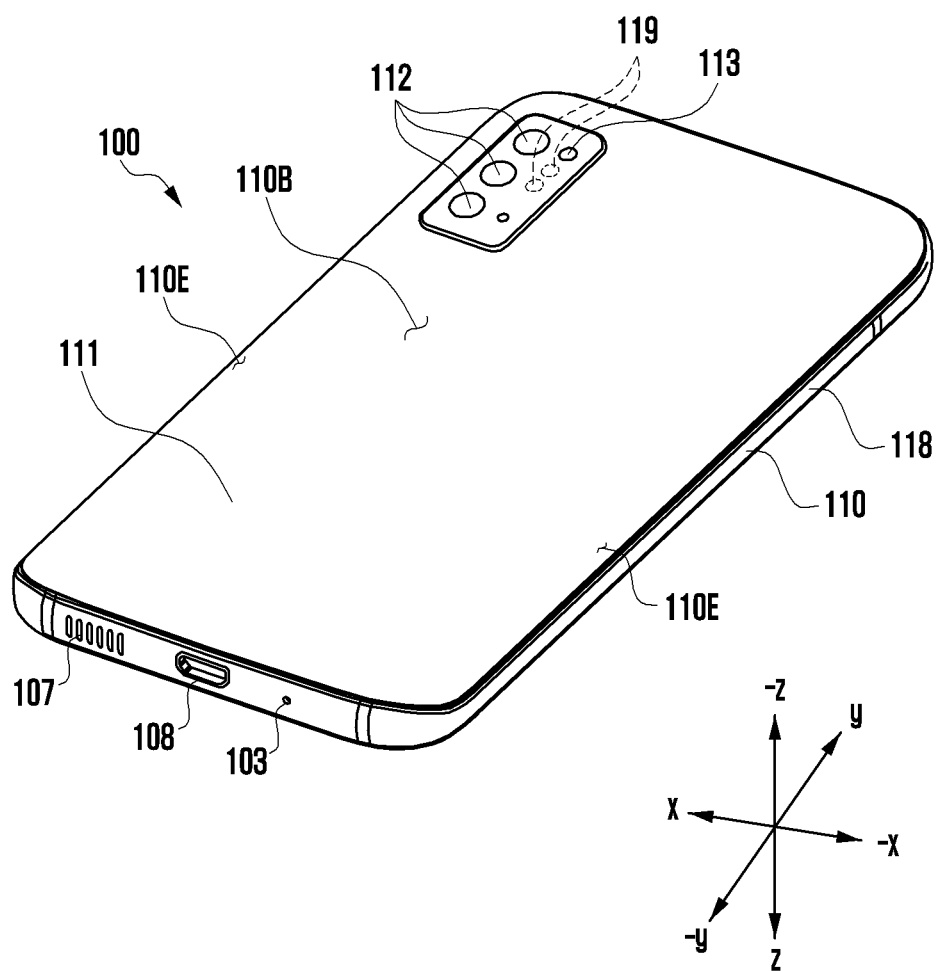
FIG. 2 is a perspective view illustrating a rear surface of the electronic device of FIG. 1 according to an embodiment of the disclosure.

FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor (not shown), and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device (e.g., camera module 105) disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an infrared (IR) LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules of camera modules 105 and 112, some sensor modules of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
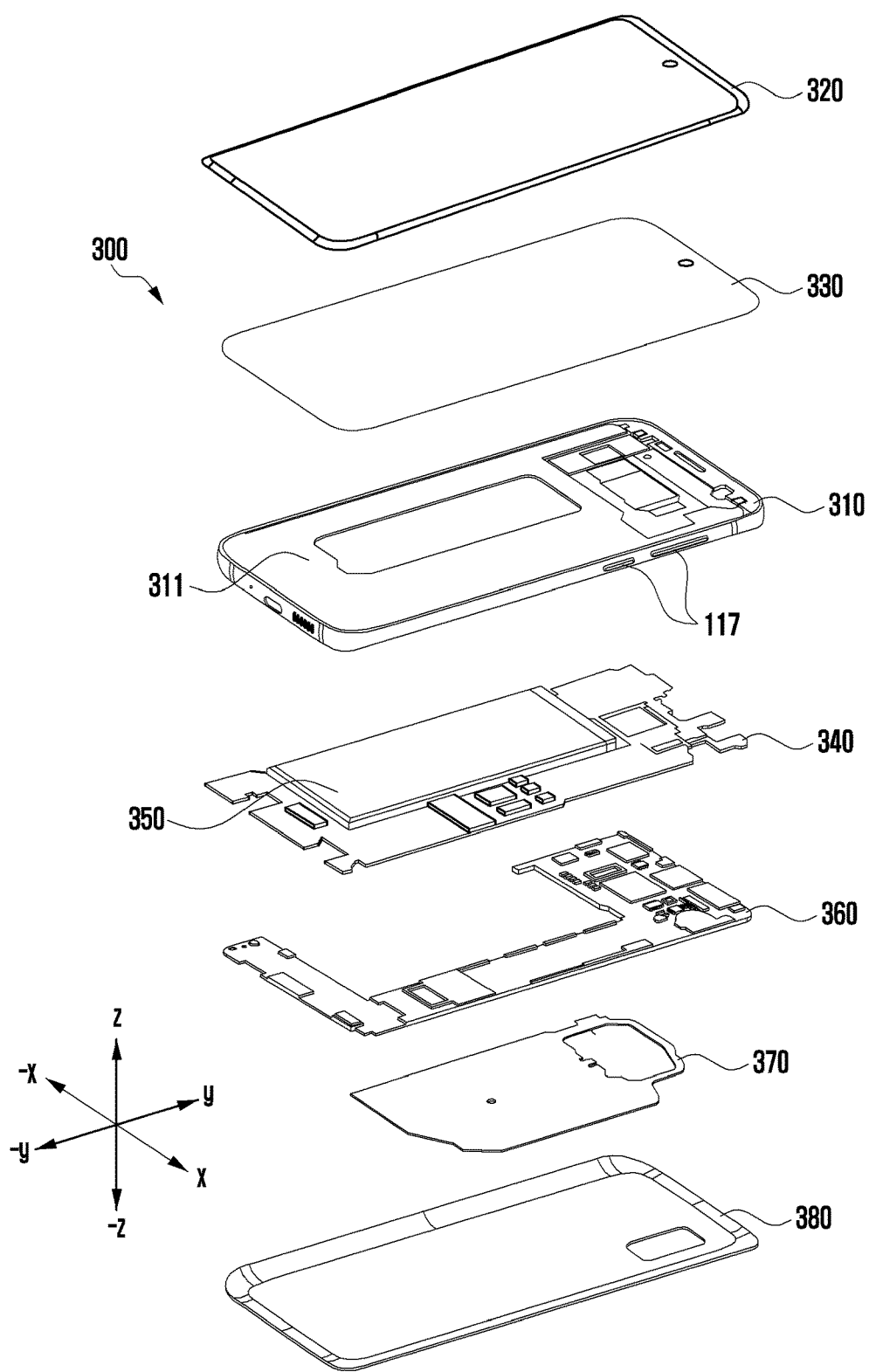
FIG. 3 is an exploded perspective view illustrating the electronic device of FIG. 1 according to an embodiment of the disclosure.

FIG. 3 illustrates an exploded perspective view showing a mobile electronic device shown in FIG. 1 according to an embodiment of the disclosure.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
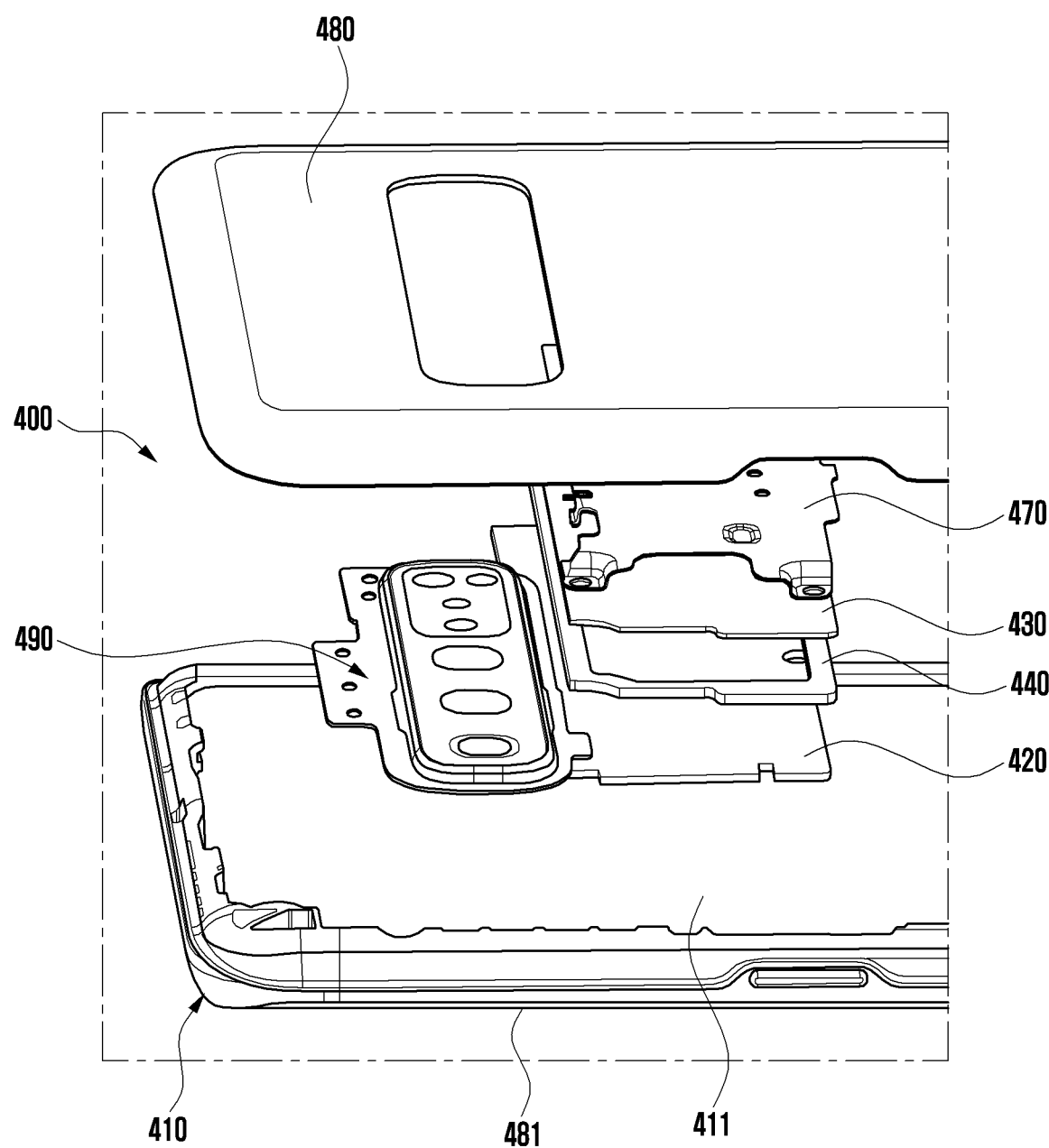
FIG. 4 is an exploded perspective view of an electronic device including an interposer applied between two boards according to an embodiment of the disclosure.

FIG. 4 is an exploded perspective view of an electronic device including an interposer applied between two boards according to an embodiment of the disclosure.

The electronic device 400 of FIG. 4 may be at least partially similar to the electronic device of FIGS. 1 and 2 and the electronic device 300 of FIG. 3, or may include another embodiment of the electronic device.

Referring to FIG. 4, the electronic device 400 (e.g., the mobile electronic device 300 in FIG. 3) may include a housing (e.g., the housing 110 in FIG. 1A) including a front cover 481 (e.g., the front plate 320 in FIG. 3), a rear cover 480 (the rear plate 380 in FIG. 3) facing away from the front cover 481, and a side frame 410 (e.g., the side member 310 in FIG. 3) surrounding the space between the front cover 481 and the rear cover 480. According to an embodiment, the electronic device 400 may include a first support member 411 (e.g., the first support member 311 in FIG. 3) disposed in the inner space thereof. According to an embodiment, the first support member 411 may be disposed to extend into the inner space from the side frame 410. As another example, the first support member 411 may be separately provided in the inner space of the electronic device 400. According to an embodiment, the first support member 411 may extend from the side frame 410, and at least a portion thereof may be formed of a conductive material. According to an embodiment, the electronic device 400 may further include a camera structure 490 disposed in a space between the front cover 481 and the rear cover 480.

According to various embodiments, the electronic device 400 may include a pair of boards 420 and 430 (e.g., a printed circuit board (PCB)) disposed between the first support member 411 and the rear cover 480 in the inner space thereof. According to an embodiment, the pair of boards 420 and 430 may be arranged to at least partially overlap each other when the front cover 481 is viewed from above. According to an embodiment, the pair of boards 420 and 430 may include a first board 420 (e.g., a main board) disposed between the first support member 411 and the rear cover 480, and a second board 430 (e.g., a sub-board) disposed between the first board 420 and the rear cover 480. According to an embodiment, the first board 420 and the second board 430 may be disposed parallel to each other.

According to various embodiments, the electronic device 400 may include an interposer 440 interposed between the first board 420 and the second board 430. According to an embodiment, the interposer 440 may include a plurality of conductive terminals, and may come into physical contact with conductive terminals disposed on the two boards 420 and 430 so as to electrically connect the two boards 420 and 430. For example, the interposer 440 may be preferentially mounted on the first board 420 through pre-solder applied to the conductive terminals. As another embodiment, the interposer 440 may be preferentially mounted on the second board 430 through pre-solder applied to the conductive terminals. According to an embodiment, the electronic device 400 may include a second support member 470 disposed between the second board 430 and the rear cover 480. According to an embodiment, the second support member 470 may be disposed at a position at which the second support member 470 at least partially overlaps the second board 430. According to an embodiment, the second support member 470 may include a metal plate. Accordingly, the first board 420, the interposer 440, and the second board 430 may be fixed to the first support member 411 via the second support member 470 disposed thereon. For example, the second support member 470 may be fastened to the first support member 411 via a fastening member such as a screw so as to reliably support electrical connection between the first board 420, the interposer 440, and the second board 430. In another embodiment, the first board 420, the interposer 440, and the second board 430 may be disposed in the inner space of the electronic device 400 without the second support member 470.

Figure 5:
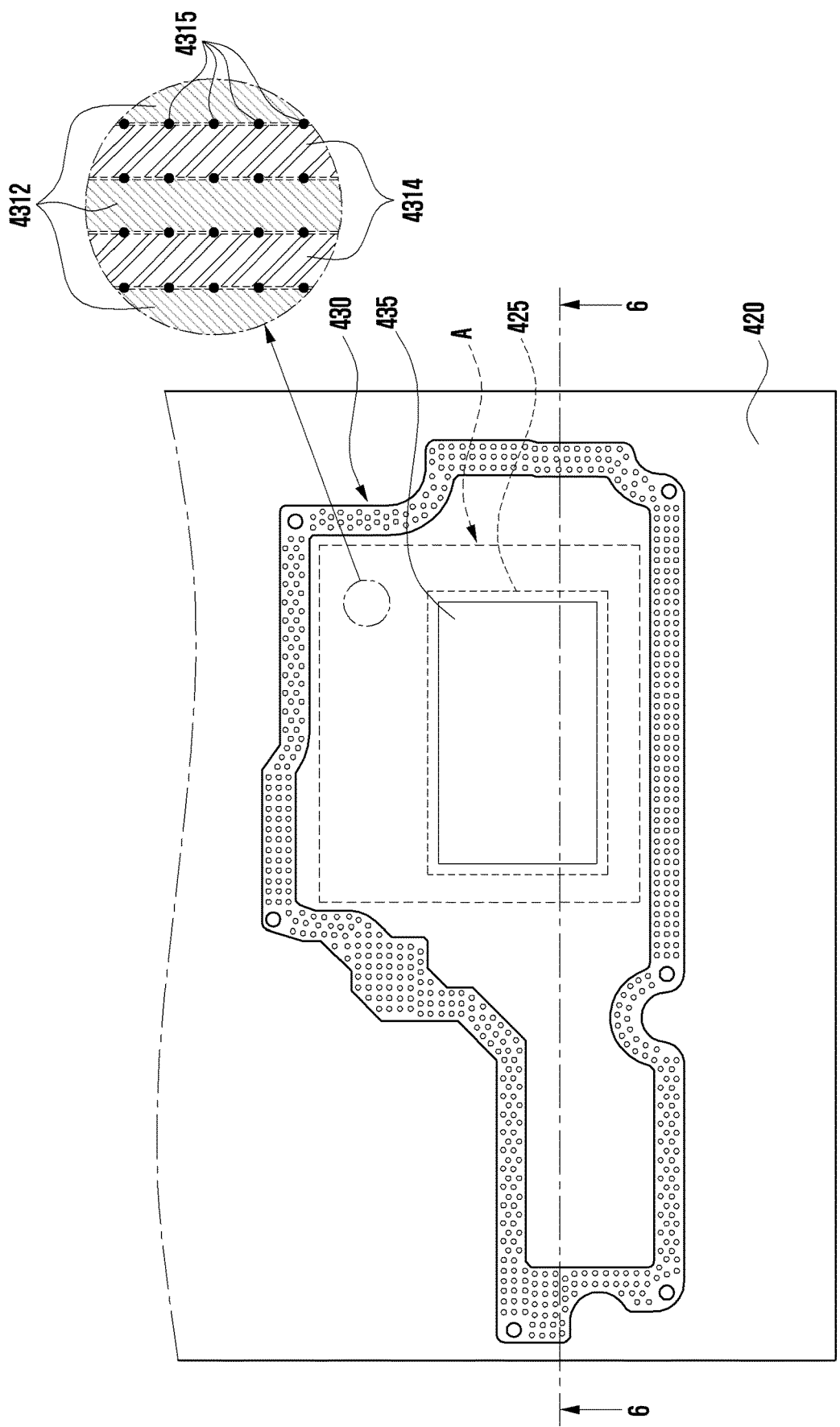
FIG. 5 is a plan view illustrating the state in which an interposer is disposed between two boards according to an embodiment of the disclosure.

FIG. 5 is a plan view illustrating the state in which an interposer is disposed between two boards according to an embodiment of the disclosure.

Figure 6:
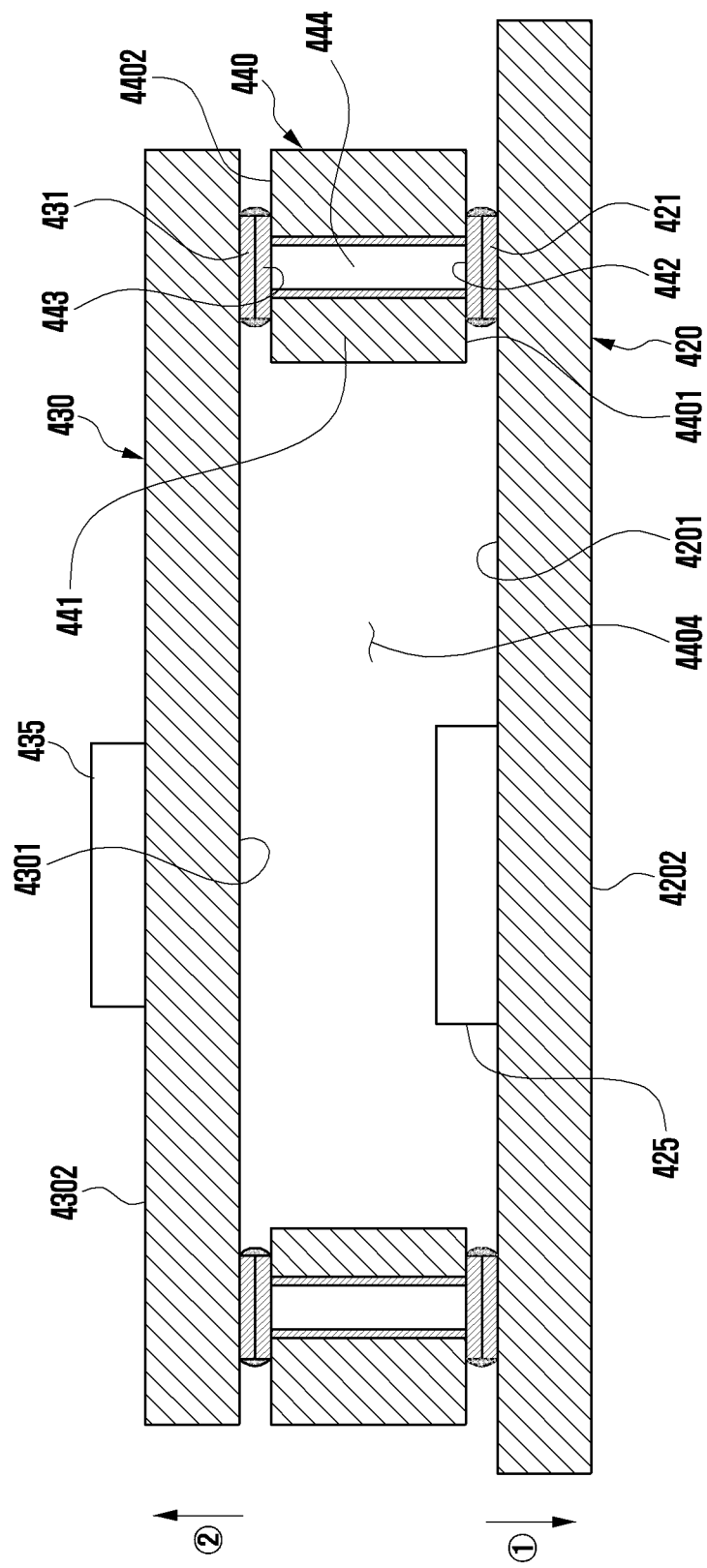
FIG. 6 is a cross-sectional view taken along line 6-6 in FIG. 5 according to an embodiment of the disclosure.

FIG. 6 is a cross-sectional view taken along line 6-6 in FIG. 5 according to an embodiment of the disclosure.

Referring to FIGS. 5 and 6, an electronic device (e.g., the electronic device 400 in FIG. 4) may include a first board 420 and a second board 430 spaced apart from and overlapping the first board 420, and an interposer 440 disposed between the first board 420 and the second board 430. According to an embodiment, the interposer 440 may include an opening 4404 therein. According to an embodiment, the opening 4404 may be formed in the form of a closed loop or in the form of an at least partially open loop through the interposer 440. According to an embodiment, the first board 420 is a main board disposed in the inner space of an electronic device (e.g., the electronic device 400 in FIG. 4), and may be larger than the second board 430. According to an embodiment, the interposer 440 may be formed in a size that substantially coincides with the edges of the second board 430 and has a predetermined width so as to surround the opening 4404. In some embodiments, the first board 420, the second board 430, and/or the interposer 440 may be formed to be the same size or in various sizes that are different from each other.

According to various embodiments, the first board 420 may include a first surface 4201 facing the second board 430 and a second surface 4202 facing away from the first surface 4201. According to an embodiment, the first board 420 may include a plurality of first conductive terminals 421 disposed to be exposed to the first surface 4201. According to various embodiments, the second board 430 may include a third surface 4301 facing the first board 420 and a fourth surface 4302 facing away from the third surface 4301. According to an embodiment, the second board 430 may include a plurality of second conductive terminals 431 disposed to be exposed to the third surface 4301. According to an embodiment, the interposer 440 may include a first board surface 4401 facing the first board 420 and a second board surface 4402 facing away from the first board surface 4401 and facing the second board 430. According to an embodiment, the interposer 440 may include a plurality of third conductive terminals 442 disposed on the first board surface 4401 to face the plurality of first conductive terminals 421 disposed on the first surface 4201 of the first board 420. According to an embodiment, the interposer 440 may include a plurality of fourth conductive terminals 443 disposed on the second board surface 4402 to face the plurality of second conductive terminals 431 disposed on the third surface 4301 of the second board 430. According to an embodiment, the plurality of third conductive terminals 442 and the plurality of fourth conductive terminals 443 may be electrically connected to each other, respectively, via conductive vias 444 (e.g., conductive posts) disposed to penetrate a dielectric board 441 from one board surface 4401 to the second board surface 4402.

According to various embodiments, the first board 420 may include a first electrical element 425 disposed on the first surface 4201 thereof. According to an embodiment, the second board 430 may include a second electrical element 435 disposed on the fourth surface 4302 thereof. According to an embodiment, the first electrical element 425 may include an application processor (AP), a communication processor (CP), or a power management integrated circuit (PMIC). According to an embodiment, the second electrical element 435 may include an RF-related element or a sound module. In some embodiments, the first electrical element 425 may be disposed on the second surface 4202 of the first board 420.

According to various embodiments, the second board 430 may include a shielding structure for blocking noise generated from the first electrical element 425 mounted on the first board 420. According to an embodiment, the area where the shielding structure is disposed (area A) may be disposed at a position overlapping at least the first electrical element 425 when the second board 430 is viewed from above. For example, noise generated by the first electrical element 425 may be blocked by the shielding structure so as not to affect the second electrical element 435. According to an embodiment, this shielding structure may be formed using a plurality of conductive slits 4312 and 4314 (e.g., the non-conductive areas) formed in conductive areas (e.g., the conductive areas 4311 and 4313 in FIG. 7), which are respectively disposed on at least two insulating layers disposed on the second board 430. For example, because a plurality of first slits 4312 formed in one insulating layer and a plurality of second slits 4314 formed in another insulating layer are disposed so as not to overlap each other when the second board 430 is viewed from above, noise generated from the first electrical element 425 can be blocked and prevented from being transmitted to the second electric element 435. According to an embodiment, the conductive areas (e.g., the conductive areas 4311 and 4313 in FIG. 7) disposed in respective insulating layers may be electrically connected to each other via a plurality of conductive vias 4315 (e.g., the plurality of conductive vias of FIG. 7), and can be electrically connected to a ground layer of the first board 420 (e.g., the first ground layer 429 in FIG. 7) and/or a ground structure inside the electronic device (e.g., a conductive bracket), thereby conducting a shielding action. In some embodiment, the plurality of conductive vias 4315 may be arranged regularly or irregularly.

Figure 7:
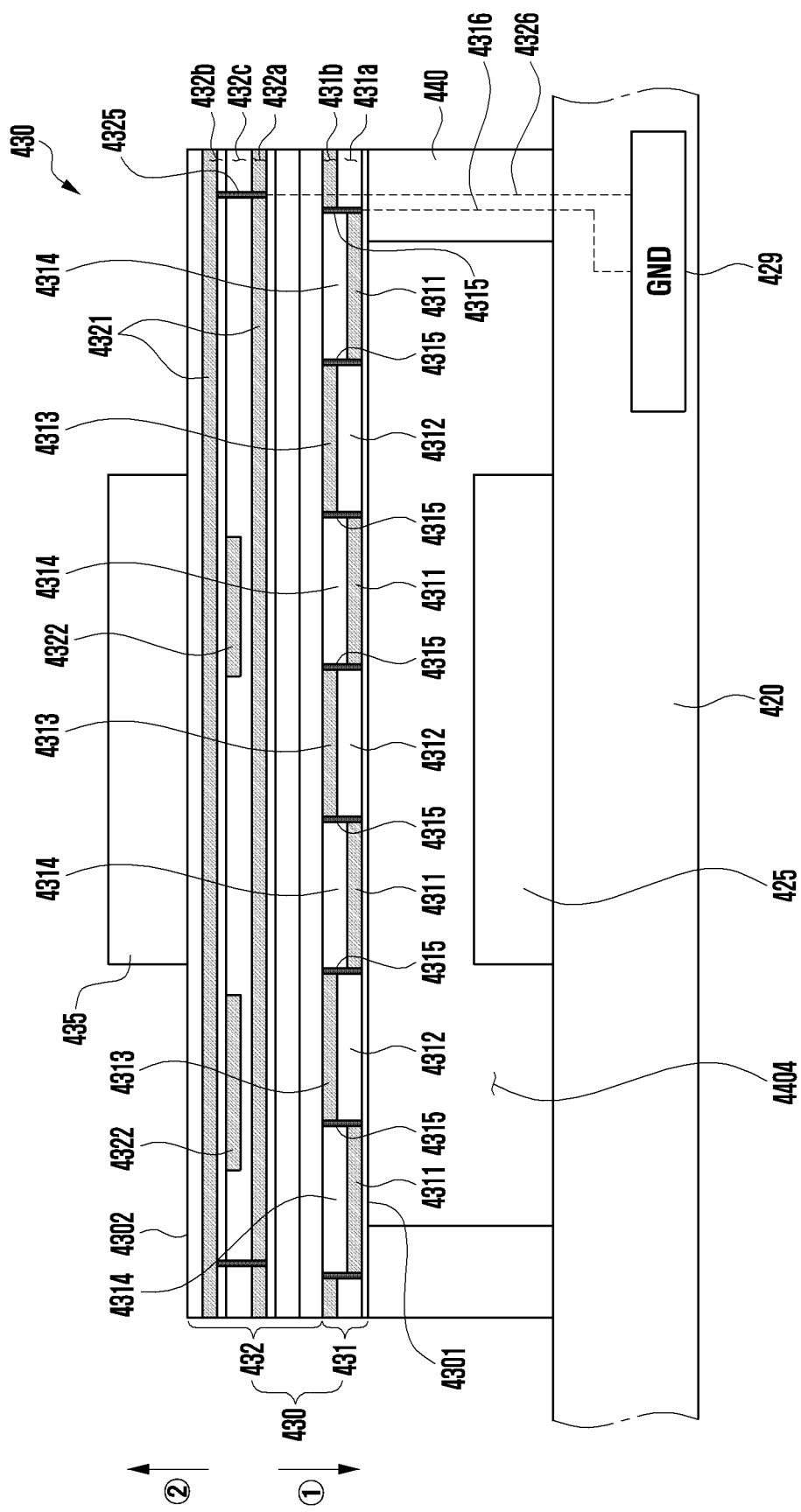
FIG. 7 is a view illustrating a stacked structure of the boards of FIG. 6 according to an embodiment of the disclosure.

FIG. 7 is a view illustrating a stacked structure of the boards and the interposer of FIG. 6 according to an embodiment of the disclosure.

Referring to FIG. 7, the second board 430 may include a first layer area 431 including a shielding structure formed through a plurality of insulating layers 431a and 431b and a second layer area 432 including a ground layer 4321 and a signal layer 4322 formed through a plurality of insulating layers 432a, 432b, and 432c. According to an embodiment, the second board 430 may include a plurality of insulating layers. According to an embodiment, the second layer area 432 may be disposed closer to the third surface 4301 than the fourth surface 4302 of the second board 430. According to an embodiment, the second layer area 432 may be disposed in the space between the first layer area 431 and the fourth surface 4302 of the second board 430.

According to various embodiments, the second board 430 may include, in the first layer area 431, a first conductive area 4311 formed in the first insulating layer 431a, and a plurality of first slits 4312 having a predetermined interval (e.g., a plurality of first non-conductive areas). According to an embodiment, the plurality of first slits 4312 may include a first insulating layer 431a in which the first conductive area 4311 is not disposed. According to an embodiment, the second board 430 may include, in the first layer area 431, a second conductive area 4313 formed in the second insulating layer 431b between the first insulating layer 431a and the second layer area 432, and a plurality of second slits 4314 having a predetermined interval (e.g., a plurality of second non-conductive areas). According to an embodiment, the plurality of second slits 4314 may include a second insulating layer 431b in which the second conductive area 4313 is not disposed. According to an embodiment, the plurality of first slits 4312 may be disposed in an area in which the plurality of first slits 4312 do not overlap the second plurality of slits 4314 when the second board 430 is viewed from above. According to an embodiment, the plurality of first slits 4312 may be disposed at a position where the plurality of first slits 4312 overlap at least the second conductive area 4313 when the second board 430 is viewed from above. According to an embodiment, the plurality of second slits 4314 may be disposed at a position where the second slits 4314 overlap at least the first conductive area 4311 when the second board 430 is viewed from above. In some embodiments, the plurality of first slits 4312 (e.g., conductive slits) may be arranged to partially overlap, to the extent that a noise-blocking function is not degraded, the plurality of second conductive slits 4314 when the second board 430 is viewed from above. According to an embodiment, the first conductive area 4311 may be electrically connected to the second conductive area 4313 via a plurality of first vias 4315, which vertically penetrate the first insulating layer 431a and the second insulating layer 431b. According to an embodiment, because the first conductive area 4311 and the second conductive area 4313 do not significantly overlap each other, the plurality of first conductive vias 4315 may help reduce interlayer impedance for preventing noise induction and reinforce a ground. According to an embodiment, the first conductive area 4311 and the second conductive area 4313 may be electrically connected to the first ground layer 429 disposed on the first board 420. For example, the first conductive area 4311 and the second conductive area 4313 may be electrically connected to the first ground layer 429 via a first electrical path 4316 (e.g., electrical wiring) connected thereto via the interposer 440. According to an embodiment, due to the shield structure formed through the arrangement in which the plurality of first slits 4312 and the plurality of second slits do not overlap each other, noise generated from the first electrical element 425 mounted on the first board 420 is not transferred to the second electrical element 435. Thus, it is possible to prevent deterioration in the performance of the second electrical element 435.

According to various embodiments, the second board 430 may include a pair of second grounds 4321, which are respectively disposed on a third insulating layer 432*a* and a fourth insulating layer 432*b*, which are spaced apart from each other, in the second layer area 432. According to an embodiment, the second board 430 may include a signal layer 4322 (e.g., an RF signal line or a data line) disposed on a fifth insulating layer 432*c* between the third insulating layer 432*a* and the fourth insulating layer 432*b* in the second layer area 432. According to an embodiment, the pair of second ground layers 4321 may be electrically connected to each other via a plurality of second conductive vias 4325, which vertically penetrate the third insulating layer 432*a*, the fourth insulating layer 432*b*, and the fifth insulating layer 432*c*. According to an embodiment, the pair of second ground layers 4321 may be electrically connected to the first ground layer 429 of the first board 420 via a second electrical path 4326 (e.g., electrical wiring) connected thereto via the interposer 440. In some embodiments, the pair of second ground layers 4321 may be directly connected to a conductive structure (e.g., a conductive bracket) disposed in the inner space of the electronic device, rather than to the first ground layer 429 of the first board 420, via a fastening member, such as a screw. For example, the second ground layer 4321 may be disposed to be electrically insulated from the first conductive area 4311 and the second conductive area 4313 in the second board 430. Therefore, noise induced from the first electrical element 425 may be directly guided to the first ground layer 429 of the first board 420, rather than to the second ground layer 4321, via the conductive areas 4311 and 4313.

According to various embodiments, the plurality of first slits 4312 and the plurality of second slits 4314 may be disposed to have different widths, lengths, and/or arrangement densities. According to an embodiment, the plurality of first slits 4312 and the plurality of second slits 4314 may be disposed to have various widths, lengths, and/or arrangement densities under the condition that the first slits and the second slits do not overlap each other when the second board 430 is viewed from above. For example, the width, length, and/or arrangement density of the first plurality of slits 4312 and the second plurality of slits 4314 may be determined based on an improved remained copper ratio for uniformly arranged distribution of conductive areas without any variation for each area of the second board 430. In some embodiments, depending on the type of the second electrical element 435, in some sections (e.g., areas) of the second board 430, some of the plurality of first slits 4312 and some of the plurality of second slits 4314 may overlap each other when the second board 430 is viewed from above. In some embodiments, in the second board 430, the slits 4312 and 4314 having a plurality of lengths may be replaced with non-conductive areas having various shapes. For example, in the second board 430, in addition to the shapes of the slits 4312 and 4314 having predetermined lengths, figures spaced at predetermined intervals (e.g., figures in the form of a periodic structure) may be replaced with non-conductive areas.

Figure 8:
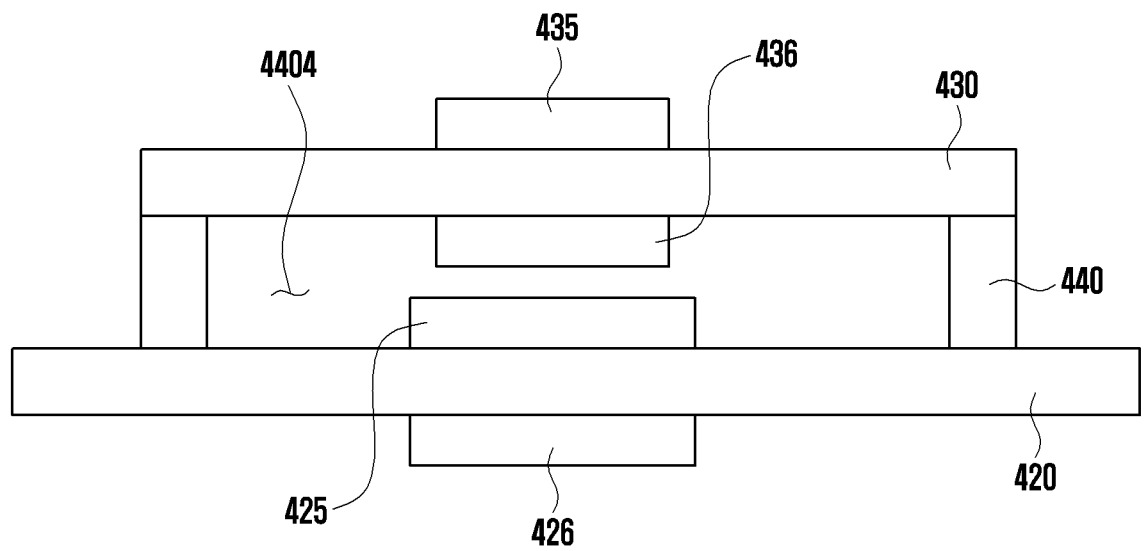
FIG. 8 is a view illustrating a configuration in the state in which an interposer is disposed between two boards according to an embodiment of the disclosure.

FIG. 8 is a view illustrating a configuration in the state in which the interposer 440 is disposed between two boards 420 and 430 according to an embodiment of the disclosure.

Referring to FIG. 8, the first board 420 and the second board 430 may include a plurality of electrical elements 425, 435, 426, and 436, with an interposer 440 interposed therebetween. For example, the first board 420 may further include, in addition to the first electrical element 425, a third electrical element 426 disposed on a surface (e.g., the second surface 4202 in FIG. 6) opposite the surface facing the second board 430. According to an embodiment, the second board 430 may include, in addition to the second electrical element 435, a fourth electrical element 436 disposed on a surface (e.g., the third surface 4301 in FIG. 6) facing the first board 420. In this case, a shielding structure including a plurality of slits (e.g., the plurality of slits 4312 and 4314 in FIG. 7) according to an embodiment may be disposed on the first board 420 and/or the second board 430. For example, when the shielding structure is disposed on the first board 420, it is possible to prevent the third electrical element 426 from being affected by noise generated from the fourth electrical device 436, due to the shielding structure.

A board according to various embodiments is provided with a shielding structure in which a plurality of slits are formed in conductive areas, which are respectively disposed in different insulating layers, so as not to overlap each other whereby it is possible to induce a uniform remained copper ratio. Further, by excluding a separate shielding structure, it is possible to improve work efficiency, and the board is able to help slim an electronic device.

According to various embodiments, an electronic device (e.g., the electronic device 400 in FIG. 4) may include: a housing (e.g., the housing in FIG. 1); a first board (e.g., the first board 420 in FIG. 7) disposed in the inner space of the housing and including a first electrical element (e.g., the first electrical element 425 in FIG. 7) and a first ground layer (e.g., the first ground layer 429 in FIG. 7); a second board (e.g., the second board 430 in FIG. 7) disposed in the inner space to be spaced apart from the first board and including a second electrical element (e.g., the second electrical element 435 in FIG. 7); and an interposer (e.g., the interposer 440 in FIG. 7) disposed between the first board and the second board so as to electrically connect the first board and the second board to each other. The second board may include: a first surface (e.g., the third surface 4301 in FIG. 7) facing the first board; a second surface (e.g., the fourth surface 4302 in FIG. 7) facing away from the first surface; a plurality of insulating layers (e.g., the first layer area 431 and the second layer area 432 in FIG. 7) disposed between the first surface and the second surface; a plurality of first slits (e.g., the plurality of first slits 4312 in FIG. 7) formed at a predetermined interval in a first conductive area (e.g., the first conductive area 4311 in FIG. 7) disposed in a first insulating layer (e.g., the first insulating layer 431*a* in FIG. 7) among the plurality of insulating layers; and a plurality of second slits (e.g., the plurality of second slits 4314 in FIG. 7) formed at a predetermined interval in a second conductive area (e.g., the second conductive area 4313 in FIG. 7) disposed in a second insulating layer (e.g., the second insulating layer 431*b* in FIG. 7) between the first insulating layer and the second surface. The plurality of first slits may be disposed at a position where the plurality of first slits do not overlap the plurality of second slits when the second board is viewed from above.

According to various embodiments, the electronic device may further include a plurality of conductive vias configured to electrically connect the first conductive area and the second conductive area to each other, and the first conductive area and/or the second conductive area may be electrically connected to the first ground layer via the interposer.

According to various embodiments, the plurality of first slits may be disposed at a position where the plurality of first slits overlap at least the second conductive area when the second board is viewed from above.

According to various embodiments, the plurality of second slits may be disposed at a position where the plurality of second slits overlap at least the first conductive area when the second board is viewed from above.

According to various embodiments, the electronic device may further include at least one second ground layer disposed on a third insulating layer between the second insulating layer among the plurality of insulating layers and the second surface, and the at least one second ground layer may be electrically connected to the first ground layer via the interposer.

According to various embodiments, the at least one second ground layer may include two ground layers and a signal layer disposed on a fourth insulating layer between the two ground layers.

According to various embodiments, the at least one second ground layer may be disposed so as to be electrically insulated from the first conductive area and the second conductive area in the second board.

According to various embodiments, the area in which the plurality of first slits and the plurality of second slits are disposed may have a size so as to overlap at least the first electrical element when the second board is viewed from above.

According to various embodiments, the first board may include a third surface facing the second board and a fourth surface facing away from the third surface, the first electrical element may be disposed on the third surface, and the second electrical element may be disposed on the second surface.

According to various embodiments, the first electrical element may include at least one of an application processor (AP), a communication processor (CP), or a power management IC (PMIC).

According to various embodiments, the second electrical element may include an RF-related element or a sound module.

According to various embodiments, the plurality of first slits and the plurality of second slits may be formed to have widths, lengths, and/or arrangement densities, which are the same as or different from each other.

According to various embodiments, the widths, lengths, and/or arrangement densities of the plurality of first slits and the plurality of second slits may be determined based on a remained copper ratio of the second board.

According to various embodiments, the first conductive area and the second conductive area do not partially overlap each other when the second board is viewed from above.

According to various embodiments, the electronic device may further include a display disposed in the inner space of the housing so as to be at least partially visible from an outside.

According to various embodiments, an electronic device (e.g., the electronic device 400 in FIG. 4) may include: a housing (e.g., the housing 110 in FIG. 1); a first board (e.g., the first board 420 in FIG. 7) disposed in an inner space of the housing and including a first electrical element (e.g., the first electrical element 425 in FIG. 7) and a first ground layer (e.g., the first ground layer 429 in FIG. 7); a second board (e.g., the second board 430 in FIG. 7) disposed in the inner space to be spaced apart from the first board and including a second electrical element (e.g., the second electrical element 435 in FIG. 7); and an interposer (e.g., the interposer 440 in FIG. 7) disposed between the first board and the second board so as to electrically connect the first board and the second board to each other. The second board may include: a first surface (e.g., the third surface 4301 in FIG. 7) facing the first board; a second surface (e.g., the fourth surface 4302 in FIG. 7) facing away from the first surface; a plurality of insulating layers (e.g., the first layer area 431 and the second layer area 432 in FIG. 7) disposed between the first surface and the second surface; a plurality of first non-conductive areas (e.g., the plurality of first slits 4312 in FIG. 7) disposed at a predetermined interval in a first conductive area (e.g., the first conductive area 4311 in FIG. 7) disposed in a first insulating layer (e.g., the first insulating layer 431a in FIG. 7) among the plurality of insulating layers; and a plurality of second non-conductive areas (e.g., the plurality of second slits 4314 in FIG. 7) disposed at a predetermined interval in a second conductive area (e.g., the second conductive area 4313 in FIG. 7) disposed in a second insulating layer (e.g., the second insulating layer 431b in FIG. 7) between the first insulating layer and the second surface. The first conductive area may be disposed to overlap the plurality of second non-conductive areas when the second board is viewed from above.

According to various embodiments, the second conductive area may be disposed to overlap the plurality of first non-conductive areas when the second board is viewed from above.

According to various embodiments, the plurality of first non-conductive areas and the plurality of second non-conductive areas may include slits having predetermined widths, lengths and/or arrangement densities.

According to various embodiments, the slits may have widths, lengths and/or arrangement densities which are the same as or different from each other.

According to various embodiments, the widths, the lengths, and/or arrangement densities of the slits may be determined based on a remained copper ratio of the second board.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   a first board disposed in an inner space of the housing and comprising a first electrical element and a first ground layer;
   a second board disposed in the inner space to be spaced apart from the first board and comprising a second electrical element; and
   an interposer disposed between the first board and the second board so as to electrically connect the first board and the second board to each other,
   wherein the second board comprises:
      a first surface facing the first board,
      a second surface facing away from the first surface,
      a plurality of insulating layers disposed between the first surface and the second surface,
      a plurality of first slits formed at a predetermined interval in a first conductive area disposed in a first insulating layer among the plurality of insulating layers, and
      a plurality of second slits formed at a predetermined interval in a second conductive area disposed in a second insulating layer between the first insulating layer and the second surface, and
   wherein the plurality of first slits are disposed at a position where the plurality of first slits do not overlap the plurality of second slits when the second board is viewed from above.

2. The electronic device of claim 1, further comprising:
a plurality of conductive vias configured to electrically connect the first conductive area and the second conductive area to each other,
wherein at least one of the first conductive area or the second conductive area is electrically connected to the first ground layer via the interposer.

3. The electronic device of claim 1, wherein the plurality of first slits is disposed at a position where the plurality of first slits overlap at least the second conductive area when the second board is viewed from above.

4. The electronic device of claim 1, wherein the plurality of second slits is disposed at a position where the plurality of second slits overlap at least the first conductive area when the second board is viewed from above.

5. The electronic device of claim 1, further comprising:
at least one second ground layer disposed on a third insulating layer between the second insulating layer among the plurality of insulating layers and the second surface,
wherein the at least one second ground layer is electrically connected to the first ground layer via the interposer.

6. The electronic device of claim 5, wherein the at least one second ground layer comprises two ground layers and a signal layer disposed on a fourth insulating layer between the two ground layers.

7. The electronic device of claim 5, wherein the at least one second ground layer is disposed so as to be electrically insulated from the first conductive area and the second conductive area in the second board.

8. The electronic device of claim 1, wherein an area in which the plurality of first slits and the plurality of second slits are disposed has a size so as to overlap at least the first electrical element in case the second board is viewed from above.

9. The electronic device of claim 1,
wherein the first board comprises:
a third surface facing the second board, and
a fourth surface facing away from the third surface,
wherein the first electrical element is disposed on the third surface, and
wherein the second electrical element is disposed on the second surface.

10. The electronic device of claim 1, wherein the first electrical element comprises at least one of an application processor (AP), a communication processor (CP), or a power management IC (PMIC).

11. The electronic device of claim 1, wherein the second electrical element comprises at least one of an RF-related element or a sound module.

12. The electronic device of claim 1, wherein the plurality of first slits and the plurality of second slits are formed to have at least one of widths, lengths, or arrangement densities that are respectively identical or different from each other.

13. The electronic device of claim 12, wherein the at least one of the widths, the lengths, or the arrangement densities of the plurality of first slits and the plurality of second slits are determined based on a remained copper ratio of the second board.

14. The electronic device of claim 1, wherein the first conductive area and the second conductive area do not partially overlap each other in case the second board is viewed from above.

15. The electronic device of claim 1, further comprising:
a display disposed in the inner space of the housing so as to be at least partially visible from an outside.

16. An electronic device comprising:
a housing;
a first board disposed in an inner space of the housing, the first board including:
a first electrical element, and
a first ground layer;
a second board disposed in the inner space, spaced apart from the first board and including a second electrical element; and
an interposer disposed between the first board and the second board to electrically connect the first board and the second board to each other,
wherein the second board comprises:
a first surface facing the first board,
a second surface facing away from the first surface,
a plurality of insulating layers disposed between the first surface and the second surface,
a plurality of first non-conductive areas disposed at a predetermined interval in a first conductive area disposed in a first insulating layer among the plurality of insulating layers, and
a plurality of second non-conductive areas disposed at a predetermined interval in a second conductive area disposed in a second insulating layer between the first insulating layer and the second surface, and
wherein the first conductive area is disposed to overlap the plurality of second non-conductive areas in case the second board is viewed from above, and
wherein the plurality of first non-conductive areas and the plurality of second non-conductive areas comprise a plurality of slits having predetermined widths, lengths and/or arrangement densities.

17. The electronic device of claim 16, wherein the second conductive area is disposed to overlap the plurality of second non-conductive areas in case the second board is viewed from above.

18. The electronic device of claim 16, wherein the plurality of slits has at least one of widths, lengths, or arrangement densities that are respectively identical or different from each other.

19. The electronic device of claim 16, wherein the at least one of the widths, the lengths, or the arrangement densities of the plurality of slits are determined based on a remained copper ratio of the second board.

* * * * *